United States Patent
Chen et al.

(10) Patent No.: US 9,281,676 B2
(45) Date of Patent: Mar. 8, 2016

(54) ADJUSTMENT DEVICE FOR CABLE MANAGEMENT ARM

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Yao-Tsung Chen, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

(*) Notice: Subject to any disclaimer, the term of this patent is extended or adjusted under 35 U.S.C. 154(b) by 224 days.

(21) Appl. No.: 14/025,200

(22) Filed: Sep. 12, 2013

(65) Prior Publication Data
US 2015/0068992 A1  Mar. 12, 2015

(51) Int. Cl.
*A47F 1/04* (2006.01)
*H02G 11/00* (2006.01)
*A47F 5/00* (2006.01)
*H05K 7/14* (2006.01)

(52) U.S. Cl.
CPC ............ *H02G 11/006* (2013.01); *A47F 5/0093* (2013.01); *H05K 7/1491* (2013.01)

(58) Field of Classification Search
CPC ..... H05K 7/02; H05K 7/1421; H05K 7/1491; F16L 3/00; F16L 3/01; F16L 3/015; F16L 3/02; F16L 3/06; H02G 11/00; H02G 11/006; A47F 5/0093

USPC .............. 211/26; 174/68.3; 248/70; 361/747
See application file for complete search history.

(56) References Cited

U.S. PATENT DOCUMENTS

| | | | |
|---|---|---|---|
| 3,133,768 A * | 5/1964 | Klakovich | 384/17 |
| 6,435,354 B1 * | 8/2002 | Gray et al. | 211/26 |
| 6,666,340 B2 * | 12/2003 | Basinger et al. | 211/26 |
| 7,097,047 B2 * | 8/2006 | Lee et al. | 211/26.2 |
| 7,472,795 B2 | 1/2009 | Dubon et al. | |
| 7,510,421 B2 * | 3/2009 | Fransen et al. | 439/449 |
| 7,554,819 B2 | 6/2009 | Chen et al. | |
| 7,654,398 B2 | 2/2010 | Bridges et al. | |
| 7,712,615 B2 | 5/2010 | Chen et al. | |
| 7,746,667 B1 | 6/2010 | Baiza et al. | |
| 7,798,581 B2 * | 9/2010 | Chen et al. | 312/265.1 |
| 7,946,666 B2 * | 5/2011 | Huang et al. | 312/333 |
| 8,231,014 B2 | 7/2012 | Chen et al. | |
| 8,251,321 B2 | 8/2012 | Chen et al. | |
| 8,668,096 B2 * | 3/2014 | Von De Linde | 211/90.02 |
| 8,872,030 B2 * | 10/2014 | McNeal et al. | 174/101 |
| 9,038,832 B2 * | 5/2015 | Hernandez-Ariguznaga | 211/26 |
| 2011/0253647 A1 * | 10/2011 | Yu et al. | 211/26 |

* cited by examiner

*Primary Examiner* — Korie H Chan
(74) *Attorney, Agent, or Firm* — Rosenberg, Klein & Lee

(57) ABSTRACT

An adjustment device for a cable management arm includes a first support member, a second support member, and a positioning member. The first support member has a plurality of holes. The second support member is movably connected to the first support member and has a through hole. The positioning member is fixed to the second support member and has a positioning portion and a resilient section connected to the positioning portion. When in use, the positioning portion partially extends through the through hole, selectively extends through one of the holes, and then is positioned by a force of the resilient section, such that the extension-length of the second support member relative to the first support member is adjusted.

8 Claims, 6 Drawing Sheets

ADJUSTMENT DEVICE FOR CABLE MANAGEMENT ARM

FIELD OF THE INVENTION

The present invention relates to an adjustment device for a cable management arm, and more particularly, to a length-extendable adjustment device for a cable management arm, and the adjustment device has positioning features.

BACKGROUND OF THE INVENTION

U.S. Pat. No. 7,472,795 B2 to Dubon et al., U.S. Pat. No. 7,654,398 B2 to Bridges et al., U.S. Pat. No. 7,746,667 B1 to Baiza et al., and U.S. Pat. No. 7,554,819 B2, U.S. Pat. No. 7,712,615 B2, U.S. Pat. No. 8,231,014 B2 and U.S. Pat. No. 8,251,321 B2 to Chen et al., disclose different cable management arms hereby incorporated by reference.

However, the cable management arms disclosed in the above mentioned references do not have the function of length-extendable, so that when a chassis is installed to a rack which has a depth less than the length of the chassis, the cables of the chassis are difficult to be managed. In order to improve the defect, the present invention is presented.

The present invention intends to provide an adjustment device for a cable management arm, wherein the length of the adjustment device is extendable relative to the rack so as to make the cable management arm be adapted to manage the cables of each of various chasses which is installed to the rack.

SUMMARY OF THE INVENTION

The present invention relates to an adjustment device for a cable management arm. The adjustment device comprises a first support member having a plurality of holes. A second support member is movably connected to the first support member and has a through hole. A positioning member is fixed to the second support member and has a positioning portion and a resilient section which is connected to the positioning portion. The positioning portion partially extends through the through hole of the second support member, selectively extends through one of the holes of the first support member, and then is positioned by a force of the resilient section. By this way, the extension-length of the second support member relative to the first support member is adjusted.

Preferably, the first support member has an end wall and a side wall which is substantially perpendicular and connected to the end wall. The plurality of holes are located on the side wall.

Preferably, the second support member has a support plate having two bent portions. The two bent portions define a path. The first support member is inserted into the path of the second support member. The second support member is linearly movable relative to the first support member by the bent portions.

Preferably, the positioning member comprises an operation portion and a connection section connected to the operation portion. The operation portion extends an upward angle relative to the connection section. The connection section is connected to one of the positioning portion and the resilient section.

Preferably, the positioning member comprises two positioning portions and two resilient sections.

Alternatively, the present invention also provides a cable management arm installed to a rack. The rack at least comprises two first posts and two second posts. Wherein, one of two slide assemblies is connected between the two first posts, while the other one is connected between the two second posts. The cable management arm comprises a first adjustment device, a second adjustment device, and an arm connected between the first and second adjustment devices. At least one of the first and second adjustment devices comprises a first support member having an end wall and a side wall substantially perpendicular and connected to the end wall. The end wall is installed to the rack. The side wall has a plurality of holes. A second support member is movably connected to the first support member and has a through hole. A positioning member is fixed to the second support member and has a positioning portion and a resilient section connected to the positioning portion. The positioning portion partially extends through the through hole of the second support member, selectively extends through one of the holes of the first support member, and then is positioned by a force of the resilient section, such that the extension-length of the second support member relative to the first support member is adjusted.

Preferably, a pivoting member is pivotally connected to the second support member and the arm.

Preferably, the pivoting member has a pivot and a handle which is substantially perpendicular and connected to the pivot.

Preferably, the positioning member comprises an operation portion and a connection section connected to the operation portion. The operation portion extends an upward angle relative to the connection section. The connection section is connected to one of the positioning portion and the resilient section.

Preferably, the operation portion is located away from a fixed point (i.e. where the fulcrum formed) of the positioning member. The positioning portion is located between the operation portion and the resilient section.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
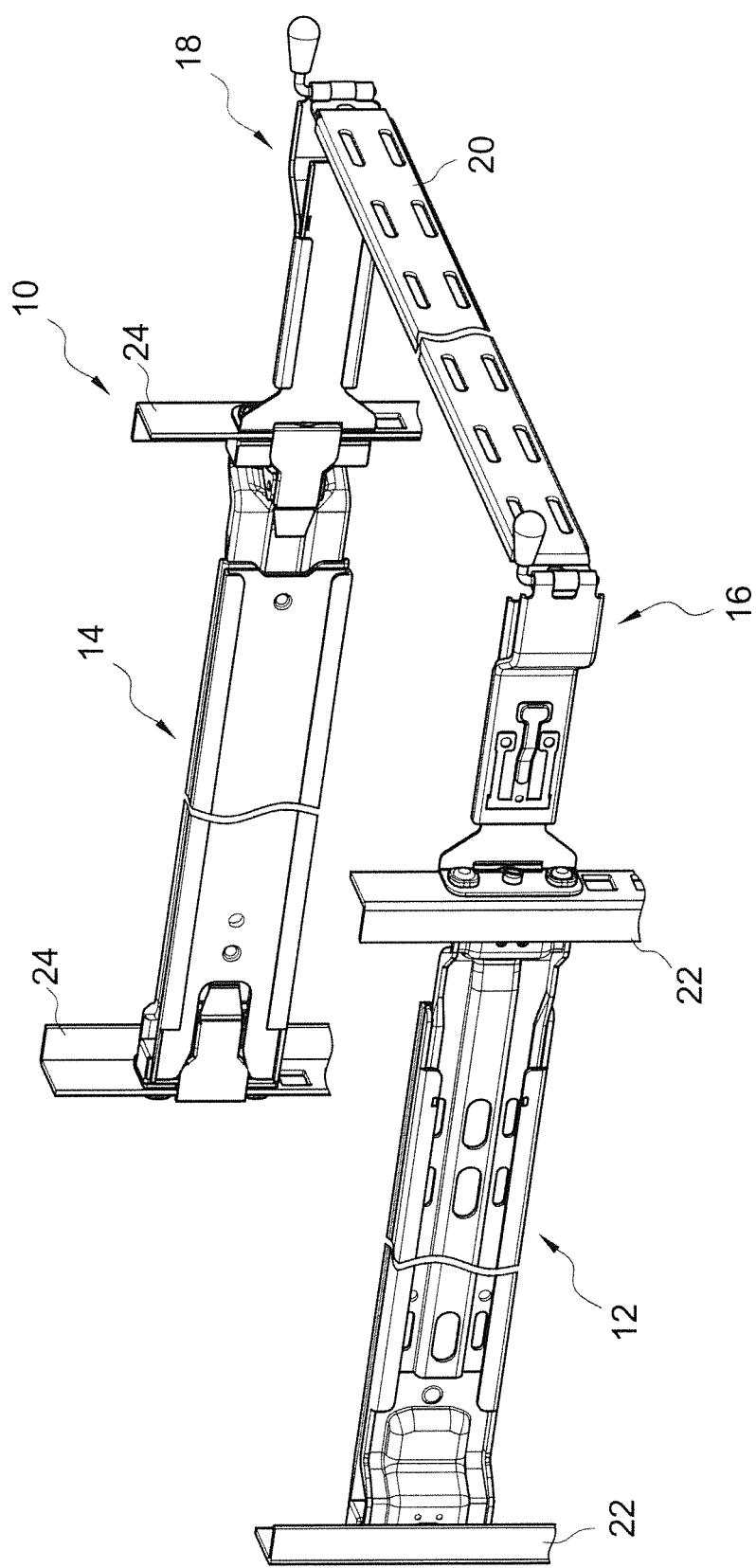
FIG. 1 is a schematic view to show that the cable management arm and two slide assemblies in accordance with the preferred embodiment of the present invention are installed to the rack.

Referring to FIG. 1, a preferred embodiment of the present invention comprises a rack 10, a first slide assembly 12, a second slide assembly 14, a first adjustment device 16, a second adjustment device 18, and an arm 20. The rack 10 comprises two first posts 22 and two second posts 24 located correspondingly. The first slide assembly 12 is connected between the two first posts 22. The second slide assembly 14 is connected between the two second posts 24. The first adjustment device 16 is installed to one of the two first posts 22 of the rack 10, and the second adjustment device 18 is installed to one of the two second posts 24 of the rack 10. The first adjustment device 16 and the second adjustment device 18 are located correspondingly. The arm 20 is connected between the first and second adjustment devices 16, 18.

Figure 2:
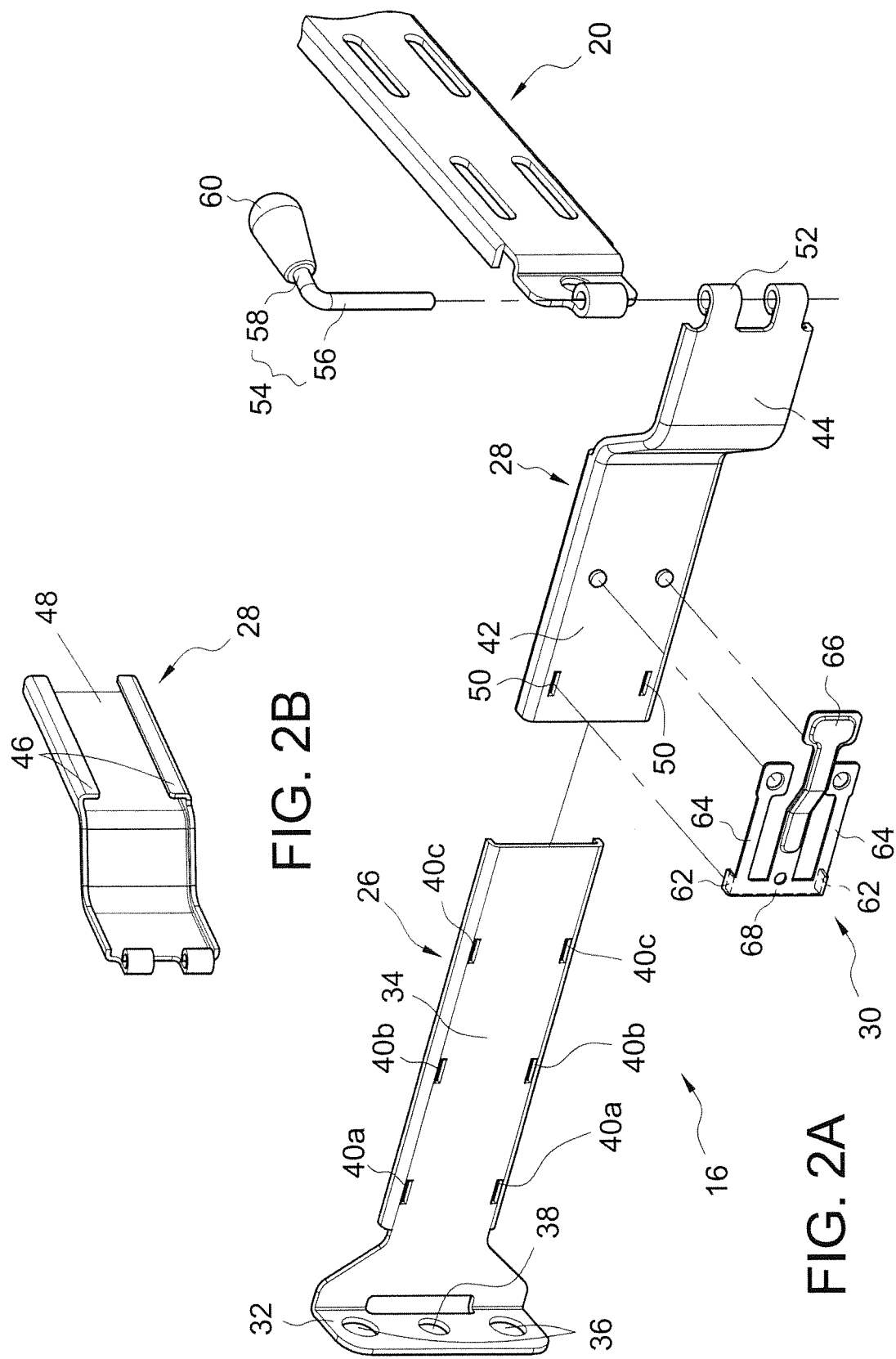
FIG. 2A is an exploded view to show the adjustment device of the cable management arm in accordance with the preferred embodiment of the present invention.
FIG. 2B is a perspective view to show the second support member of the cable management arm in accordance with the preferred embodiment of the present invention.
Figure 3:
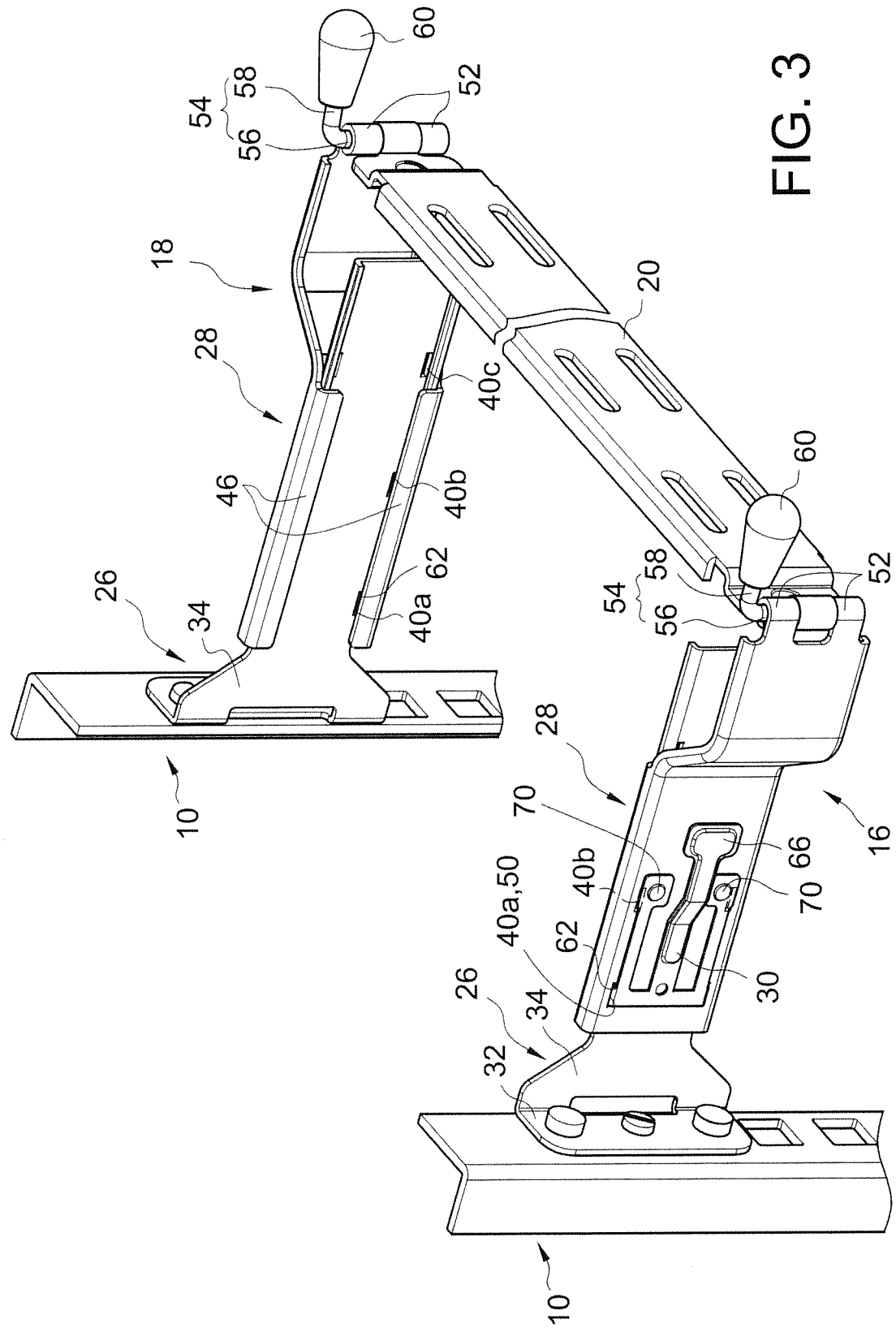
FIG. 3 is a schematic view to show that the cable management arm in accordance with the preferred embodiment of the present invention is installed to a rack.

FIGS. 2A, 2B, and 3 show the structures of the first and second adjustment devices 16, 18. In a preferred embodiment of the present invention, the first and second adjustment devices 16, 18 have the same structure and are located symmetrically. Herewith, the first adjustment device 16 is taken in the FIGS for illustration. The first adjustment device 16 comprises a first support member 26, a second support member 28, and a positioning member 30, wherein the first support member 26 has an end wall 32 and a side wall 34 substantially perpendicular and connected to the end wall 32. The end wall 32 is removably installed to the rack 10. In a preferred embodiment, the end wall 32 has two installation holes 36 and a locking hole 38, and the side wall 34 has a plurality of holes, at least, including a first hole 40a, a second hole 40b, and a third hole 40c, wherein a distance is formed between any two adjacent holes.

The second support member 28 is movably connected to the first support member 26. The second support member 28 has a support plate 42 and a connection plate 44, which extends at an angle from one end of the support plate 42. The support plate 42 has two bent portions 46, which define a path 48, so that the first support member 26 can be inserted into the path 48 of the second support member 28, and the second support member 28 can be linearly moved relative to the first support member by the bent portions 46. The support plate 42 has at least one through hole 50 so that when the second support member 28 is linearly moved relative to the first support member 26, the through hole 50 is able to be aligned with the first, second and third holes 40a, 40b, 40c in sequence. The connection plate 44 has a pivoting portion 52. A pivoting member 54 is removably and pivotably connected to the pivoting portion 52 of the connection plate 44 of the second support member 28 and the arm 20. In a preferred embodiment, the pivoting member 54 has a pivot 56 and a handle 58, which is substantially perpendicular and connected to the pivot 56. The pivoting member 54 is connected to the pivoting portion 52 of the connection plate 44 and the arm 20 by the pivot 56. By holding the handle 58, a user can remove the pivot 56 of the pivoting member 54 from the pivoting portion 52 of the connection plate 44 and the arm 20. Preferably, a fitting 60 is fitted on the handle 58 to facilitate the operation to the pivoting member 54.

The positioning member 30 is fixed, for example by a rivet, to the second support member 28. The positioning member 30 comprises at least one positioning portion 62 and at least one resilient section 64 connected to the positioning portion 62. The positioning portion 62 partially extends through the through hole 50 of the second support member 28. The positioning member 30 is fixedly connected to the second support member 28 by a portion of the resilient section 64 so as to form a fulcrum 70.

In one preferred embodiment, the positioning member 30 further comprises an operation portion 66 and a connection section 68 connected to the operation portion 66, wherein the operation portion 66 extends an upward angle relative to the connection section 68, so that the user can easily press or pull the operation portion 66. The connection section 68 is connected to one of the positioning portion 62 and the resilient section 64. Preferably, the positioning member 30 comprises two positioning portions 62 and two resilient sections 64, and the connection section 68 is connected between the two positioning portions 62. Similarly, the support plate 42 of the second support member 28 has pairs of the through holes 50. The side wall 34 of the first support member 26 has pairs of the first holes 40a, the second holes 40b, and the third holes 40c. Preferably, the operation portion 66 and the positioning portion 62 as well as the resilient section 64 of the positioning member 30 are located on opposite sides with respect to the fixed point, where the positioning member 30 fixed to the second support member 28.

Figure 4A:
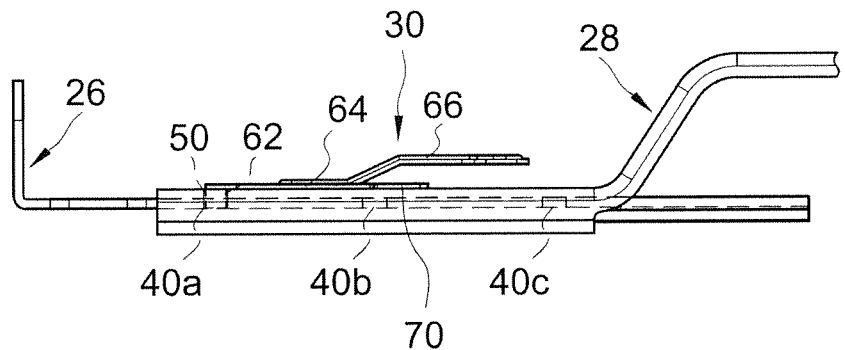
FIG. 4A is a schematic view to show that the adjustment device of the cable management arm in accordance with the preferred embodiment of the present invention is in a positioned status.

FIGS. 3 and 4A show that the end wall 32 of the first support member 26 is installed to the rack 10. The positioning portion 62 of the positioning member 30 extends through the through hole 50 of the second support member 28 and the first hole 40a of the first support member 26 and then is positioned by a force of the resilient section 64. Therefore, the positioning portion 62 of the positioning member 30 extends through the first hole 40a of the first support member 26 to be positioned.

Figure 4B:
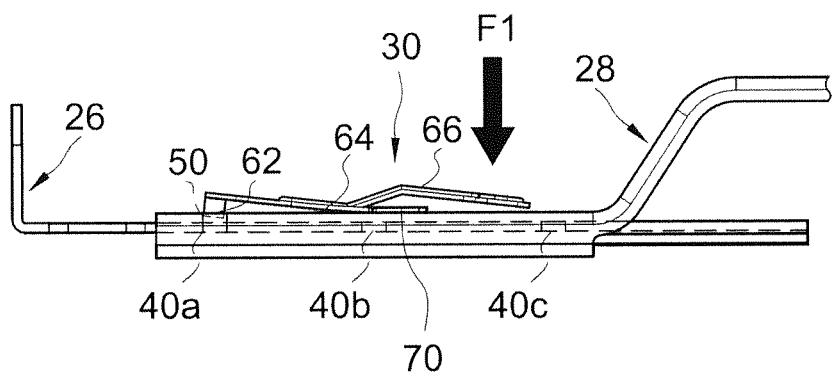
FIG. 4B is a schematic view to show the operation to the adjustment device of the cable management arm in accordance with the preferred embodiment of the present invention.
Figure 4C:
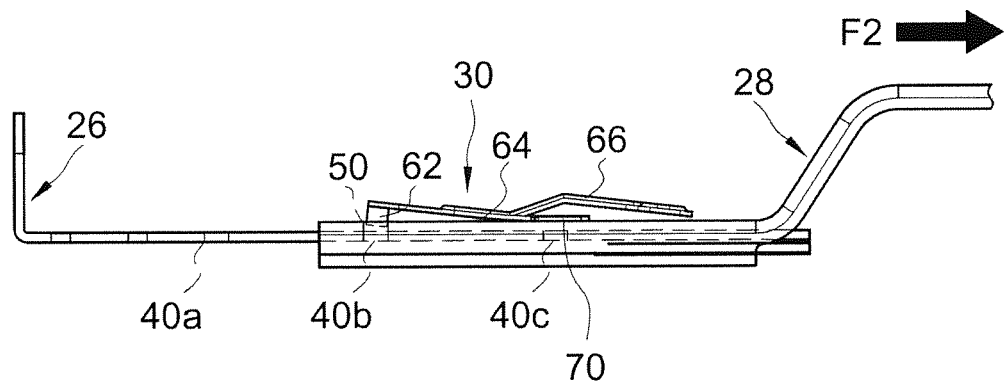
FIG. 4C is a schematic view to show the movement of the adjustment device of the cable management arm in accordance with the preferred embodiment of the present invention.

FIGS. 4B and 4C show that when an external force F1, such as a pressing force, is applied to the operation portion 66 of the positioning member 30, the positioning portion 62 of the positioning member 30 is apart from the through hole 50 of the second support member 28 and the first hole 40a of the first support member 26, such that the extension-length of the second support member 28 relative to the first support member 26 can be adjusted in a direction of F2. Therefore, the positioning portion 62 selectively extends through one of the second and third holes 40b, 40c of the first support member 26 to be positioned.

Figure 5A:
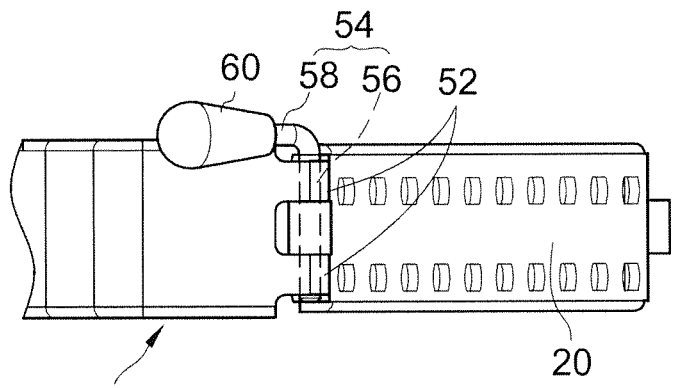
FIG. 5A is a schematic view to show that the arm of the cable management arm in accordance with the preferred embodiment of the present invention is pivotably connected to the second support member by a removable pivoting member.
Figure 5B:
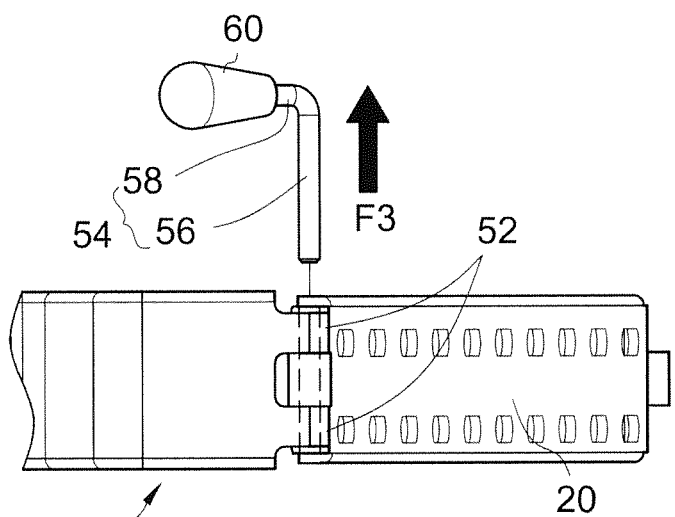
FIG. 5B is a schematic view to show the removable pivoting member being removed from the arm of the cable management arm in accordance with the preferred embodiment of the present invention.
Figure 5C:
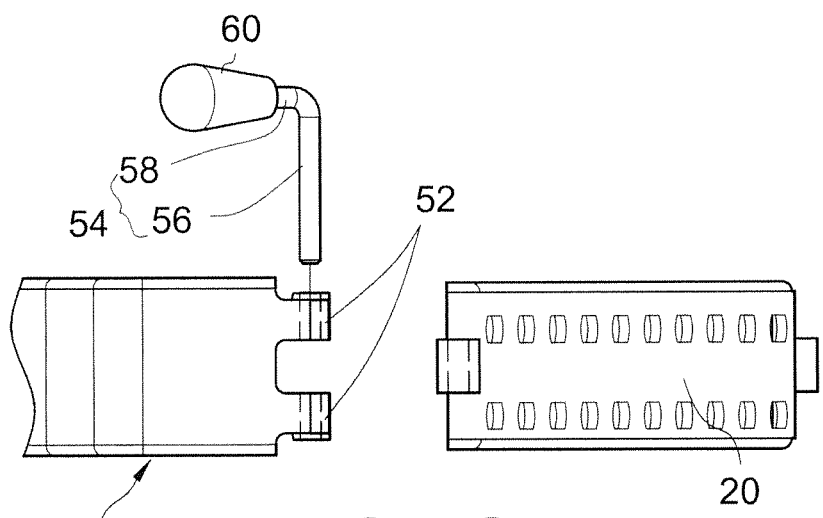
FIG. 5C is a schematic view to show that the arm of the cable management arm in accordance with the preferred embodiment of the present invention is separated from the second support member.

FIGS. 5A to 5C show that the removable pivoting member 54 is connected to the pivoting portion 52 of the connection plate 44 of the second support member 28 and the arm 20.

When an external force F3 is applied to the handle 58 of the pivoting member 54, the pivoting member 54 can be easily removed from the pivoting portion 52 of the connection plate 44 of the second support member 28 and the arm 20, so that one end of the arm 20 can be temporarily separated from the second support member 28 to facilitate the maintenance of the servers (not shown) in the rack 10, such as replacement of the power modules or cables.

Figure 6:
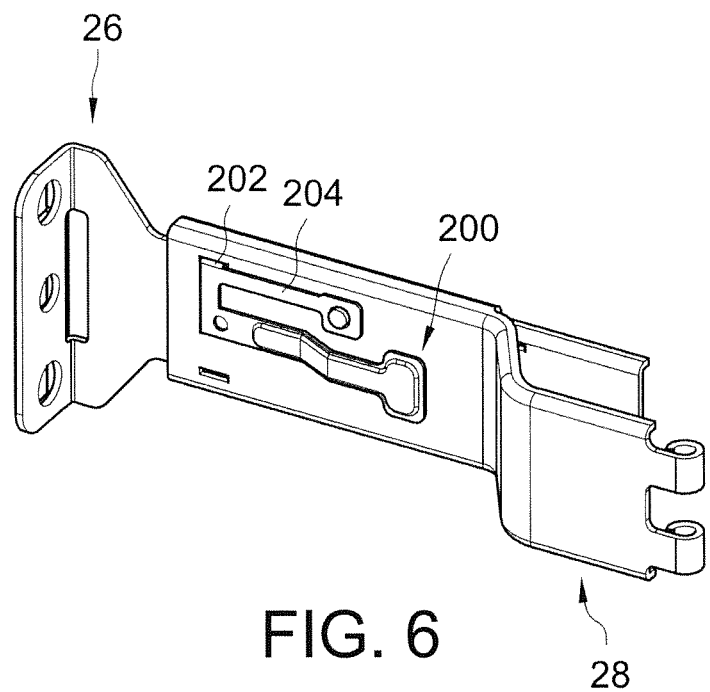
FIG. 6 is a schematic view to show the positioning member in accordance with the second embodiment of the present invention.

FIG. 6 shows the second preferred embodiment of the present invention, wherein the positioning member 200 has only one positioning portion 202 and one resilient section 204, which can also achieve the same positioning function as that provided in the foregoing embodiment.

Figure 7:
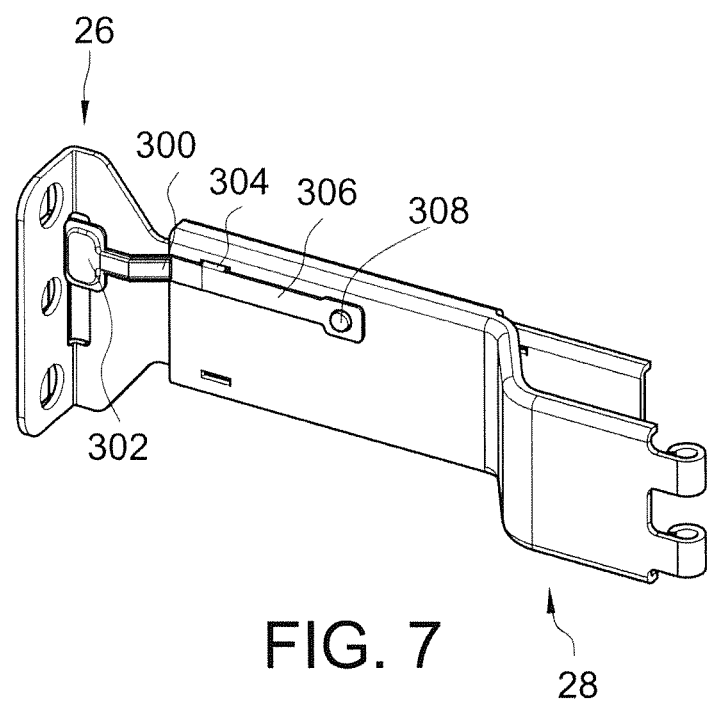
FIG. 7 is a schematic view to show the positioning member in accordance with the third embodiment of the present invention.

FIG. 7 shows the third preferred embodiment, wherein the positioning member 300 has an operation portion 302, a positioning portion 304, and a resilient section 306. The operation portion 302 is located away from a fixed point, where the fulcrum 308 is formed, of the positioning member 300. The positioning portion 304 is located between the operation portion 302 and the resilient section 306 so that the operation portion 302 is operated by a pull.

While we have shown and described the preferred embodiment in accordance with the present invention, it should be clear to those skilled in the art that further embodiments may be made without departing from the scope of the present invention.

What is claimed is:

1. A cable management arm, comprising:
    a first adjustment device, a second adjustment device, and an arm connected between the first and second adjustment devices, said first and second adjustment devices comprising:
    a first support member having an end wall and a side wall substantially perpendicular and connected to the end wall, the side wall having a plurality of holes;
    a second support member movably connected to the first support member and having a through hole; and
    a positioning member fixed to the second support member and having a positioning portion and a resilient section connected to the positioning portion, wherein the positioning portion partially extends through the through hole of the second support member, selectively extends through one of the holes of the first support member, and then is positioned by a force of the resilient section, such that an extension-length of the second support member relative to the first support member is adjusted.

2. The cable management arm of claim 1, wherein the end wall of the first support member of the first adjustment device and the end wall of the first support member of the second adjustment device are connected to a rack.

3. The cable management arm of claim 1, further comprising a first pivoting member pivotally connected to the second support member of the first adjustment device and a second pivoting member pivotally connected to the second support member of the second adjustment device, said pivoting members removably connecting the arm to the first and second adjustment devices.

4. The cable management arm of claim 3, wherein the pivoting member has a pivot and handle substantially perpendicular to and connected to the pivot.

5. The cable management arm as claimed in claim 1, wherein the positioning member comprises an operation portion and a connection section connected to the operation portion, the operation portion extending an upward angle relative to the connection section, the connection section connected to one of the positioning portion and the resilient section.

6. The cable management arm as claimed in claim 5, wherein the operation portion is located away from a fixed point of the positioning member, and the positioning portion is located between the operation portion and the resilient section.

7. The cable management arm as claimed in claim 2, wherein the rack comprises at least two first posts and two second posts, and wherein a first slide assembly is connected between the two first posts, and a second slide assembly is connected between the two second posts.

8. The cable management arm as claimed in claim 7, wherein the first support member of the first adjustment device is connected to the first post opposite the first slide assembly, and the first support member of the second adjustment device is connected to the second post opposite the second slide assembly.

* * * * *